(12) United States Patent
Throckmorton et al.

(10) Patent No.: US 12,215,419 B2
(45) Date of Patent: Feb. 4, 2025

(54) SMOOTHING SURFACE ROUGHNESS USING ATOMIC LAYER DEPOSITION

(71) Applicants: Eagle Technology, LLC, Melbourne, FL (US); University of Colorado Boulder, Boulder, CO (US)

(72) Inventors: James Throckmorton, Rochester, NY (US); Tyler Myers, Helsinki (FI); Rebecca Borrelli, Rochester, NY (US); Malcolm O'Sullivan, Melbourne, FL (US); Tukaram Hatwar, Penfield, NY (US); Steven M. George, Boulder, CO (US)

(73) Assignees: Eagle Technology, LLC, Melbourne, FL (US); University of Colorado Boulder, Boulder, CO (US)

( * ) Notice: Subject to any disclaimer, the term of this patent is extended or adjusted under 35 U.S.C. 154(b) by 266 days.

(21) Appl. No.: 17/733,575

(22) Filed: Apr. 29, 2022

(65) Prior Publication Data

US 2023/0349042 A1 Nov. 2, 2023

(51) Int. Cl.
| | | |
|---|---|---|
| *C23C 16/455* | (2006.01) | |
| *C23C 16/02* | (2006.01) | |
| *C23C 16/34* | (2006.01) | |
| *C23C 16/40* | (2006.01) | |
| *C23C 28/04* | (2006.01) | |

(52) U.S. Cl.
CPC .... *C23C 16/45525* (2013.01); *C23C 16/0254* (2013.01); *C23C 16/345* (2013.01);
(Continued)

(58) Field of Classification Search
CPC ...... C23C 16/45525; G02B 1/00; G02B 5/28; H01L 21/31051
See application file for complete search history.

(56) References Cited

U.S. PATENT DOCUMENTS

| | | | |
|---|---|---|---|
| 10,017,384 B1 | 7/2018 | Greer et al. | |
| 2016/0035914 A1* | 2/2016 | Deliwala | G02B 5/28 |
| | | | 438/70 |

(Continued)

FOREIGN PATENT DOCUMENTS

| | | | |
|---|---|---|---|
| DE | 102015203307 B3 | 4/2016 | |
| DE | 102016100907 B4 | 7/2019 | |

(Continued)

OTHER PUBLICATIONS

Tyler J. Myers et al, Applied Surface Science 569(2021) 150878. (Year: 2021).*

(Continued)

*Primary Examiner* — Tabassom Tadayyon Eslami
(74) *Attorney, Agent, or Firm* — Edell, Shapiro & Finnan, LLC

(57) ABSTRACT

Methods of producing an optical surface atop an exterior of a substrate that includes smoothing the exterior using an ALD process to sequentially deposit ALD layers to produce one or more ALD films that fill spaces between spaced-apart asperities existing on the exterior, and thereafter depositing a reflective material on the smoothed exterior of the substrate to produce the optical surface. The smoothing resulting from depositing the ALD film on the exterior of the substrate causes the grain size of the reflective material to be reduced in comparison to the grain size that would exists without having deposited the ALD film on the exterior of the substrate. The smoothing is sufficient to cause a reduction in grain size that results in a reduction in plasmon absorption in the optical surface in comparison to the plasmon absorption that would otherwise exist without having reduced the grain size of the reflective material.

21 Claims, 12 Drawing Sheets

(52) U.S. Cl.
CPC .......... *C23C 16/402* (2013.01); *C23C 16/403* (2013.01); *C23C 16/405* (2013.01); *C23C 16/407* (2013.01); *C23C 28/042* (2013.01)

(56) References Cited

U.S. PATENT DOCUMENTS

2021/0132269 A1   5/2021   Forcht et al.
2021/0335595 A1   10/2021  Pore et al.

FOREIGN PATENT DOCUMENTS

DE   102016100914 B4   7/2019
DE   102018105859 A1   9/2019

OTHER PUBLICATIONS

J. W. Elam et al, Thin Solid Films, 414, 1(2002) pp. 43-55. (Year: 2002).*
F. Foster et al, J. Phys.: Condens. Matter 21(2009)224026(20pp). (Year: 2009).*
Au W. S., et al., "SurfaceSurface Smoothing Effect of an Amorphous Thin Film Deposited By Atomic Layer Deposition on a Surface With Nano-Sized Roughness", AIP Advances, vol. 4(2), pp. 027120-1-027120-5, (2014).
Saleem, M. R., et al., "Impact of Atomic Layer Deposition to Nanophotonic Structures and Devices", Frontiers in Materials, vol. 1, Article 18, pp. 1-15 (2014).

* cited by examiner

SMOOTHING SURFACE ROUGHNESS USING ATOMIC LAYER DEPOSITION

TECHNICAL FIELD

The present invention relates to methods for producing optical surfaces by smoothing surface roughness using atomic layer deposition.

BACKGROUND

Surface roughness affects the performance of optical devices in that it is at least partially determinative of how light is scattered, reflected and transmitted. There are many processes used to smooth surfaces. These include chemical etching, chemical mechanical polishing (CMP), magneto-rheological finishing, electrochemical micromachining, and ion beam erosion. These processes can smooth with high precision, but can also be abrasive, change the surface curvature, or damage the underlying substrate. Many smoothing processes would benefit from an alternative smoothing technique that removes roughness without negatively impacting the surface.

Atomic layer deposition (ALD) is a thin film deposition process that coats materials with atomic scale control. Gas-phase reactants are introduced to a substrate one at a time to precisely build up the material. These sequential surface reactions are self-limiting, meaning once all surface sites have reacted, the reaction effectively saturates. This allows for precise digital control of film thickness. ALD has been used to deposit many materials including numerous oxides, nitrides and sulfides. Due to the self-limiting nature of the surface reactions, films deposited by ALD are highly conformal and cover the surface with a uniform layer of material. This conformality allows ALD to act as the reverse of CMP. Rather than etching away the surface asperities, ALD can "pinch-off" surface roughness by filling in the gaps between the surface features.

Atomic layer deposition involves growing a film on a substrate by exposing its surface to alternate gaseous species (typically referred to as precursors or reactants). In contrast to chemical vapor deposition, the precursors are never present simultaneously in the reactor, but they are inserted as a series of sequential, non-overlapping pulses. In each of these pulses the precursor molecules react with the surface in a self-limiting way, so that the reaction terminates once all the reactive sites on the surface are consumed. By varying the number of cycles it is possible to grow materials uniformly and with high precision on a host of complex and large substrates.

SUMMARY

According to some implementations, a method of producing an optical surface (e.g. a surface of a mirror) is provided. According to a first step, a substrate is obtained having an exterior on which the optical surface is to reside, the exterior including laterally spaced-apart asperities having peaks that are spaced <1000 nm apart and affect optical performance of the produced optical surface absent a smoothing of the exterior surface. According to a second step, the exterior of the substrate is smoothed using an atomic layer deposition process to sequentially deposit a first plurality of ALD layers (e.g. $Al_2O_3$ layers) to produce an ALD film that fills spaces between the laterally spaced-apart asperities existing on the exterior surface. According to a third step, a reflective material (e.g. silver) is deposited on the smoothed exterior of the substrate that includes the ALD film surface to produce the optical surface. The smoothing resulting from depositing the ALD film on the exterior of the substrate causes the grain size of the reflective material to be reduced in comparison to the grain size that would otherwise exists without having deposited the ALD film on the exterior of the substrate. The ALD film has a thickness sufficient to cause a reduction in the grain size of the reflective material that results in a reduction in plasmon absorption in the optical surface in comparison to the plasmon absorption that would otherwise exist without having reduced the grain size of the reflective material. According to some implementations the grain size of the reflective material is caused to be in the range of 50 to 1000 nanometers.

According to some implementations, each of the laterally spaced-apart asperities of the exterior of the substrate has a peak and the ALD film has a thickness of no more than one half an average lateral distance between the peaks.

According to some implementations the power spectral density of a surface topography of the exterior of the substrate that includes the ALD film surface is determined using atomic force microscopy as a function of spatial frequency after the smoothing of the exterior of the substrate using the atomic layer deposition process. Thereafter, the determined power spectral density is compared to a predetermined target power spectral density at one or more spatial frequencies, the predetermined target power spectral density at the one or more spatial frequencies corresponding to a target roughness of the exterior of the substrate before the step of depositing the reflective material. Upon a determining that the exterior of the substrate that includes the ALD film surface has a roughness greater than the target roughness, an additional step of smoothing the exterior of the substrate (including the ALD film surface) is performed, using the atomic layer deposition process to sequentially deposit a second plurality of ALD layers onto the exterior of the substrate prior to depositing the reflective material.

According to other implementations, the producing of an optical surface may comprise a first step of obtaining a substrate having an exterior on which the optical surface is to reside, the exterior including laterally spaced-apart asperities having peaks that are spaced <1000 nm apart and affect optical performance of the produced optical surface absent a smoothing of the exterior surface. Thereafter, the exterior of the substrate is processed using an atomic layer deposition process to sequentially deposit a first plurality of ALD layers to produce a first ALD film that fills spaces between the laterally spaced-apart asperities existing on the exterior surface. This is followed by depositing one or more layers of a metal onto a surface of the first ALD film using a physical vapor deposition process to form a metal film over the surface of the first ALD film. Next, the surface of the metal film is smoothed using an atomic layer deposition process to sequentially deposit a second plurality of ALD layers to produce a second ALD film over the metal film. Subsequently, a reflective material (e.g. silver) is deposited on a surface of the second ALD film to produce the optical surface.

These and other advantages and features will become evident in view of the drawings and detailed description.

DETAILED DESCRIPTION

Figure 1A:
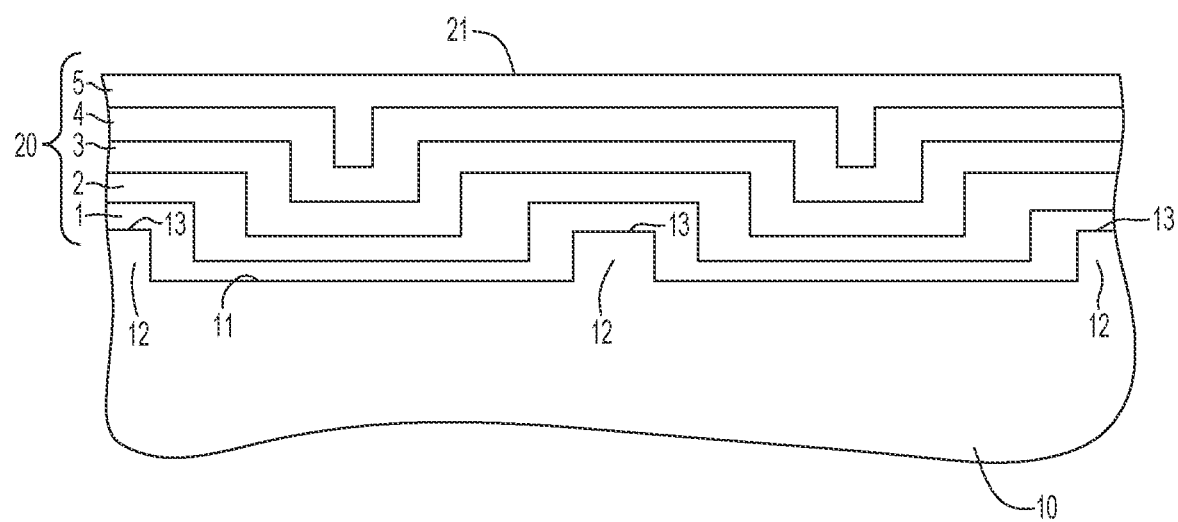
FIG. 1A illustrates a cross-section view of a substrate having an exterior surface with laterally spaced asperities, the substrate having deposited thereon a plurality of ALD layers for the purpose of producing a smoothed surface on which an optical surface may be formed.

Surface roughness can affect performance of high reflectivity mirrors. The main mechanism of reflectance loss in optical devices is through optical scattering. When light interacts with a rough surface, some light will specularly reflect at the same angle as the incident photon. Other light will be diffusely reflected at non-specular angles. A surface with roughness can be described as a superposition of sinusoidal structures that will lead to diffuse scattering resulting from diffraction. Conventional techniques can smooth mirror surfaces, but can affect the mirror curvature and require additional processing steps. ALD may be able to smooth the surface roughness of a mirror without affecting its curvature. In addition, ALD can be scaled up to accommodate larger mirror substrates. Compared with other smoothing techniques, ALD is also an additive process that can improve surface roughness without being destructive.

Before now, optical mirrors were produced with little to no consideration of nanometer-sized roughness features residing on their surface. This is because the nanometer-sized features were thought to be too small to significantly affect the reflectivity of light at the mirror's surface. However, it has been discovered that in some applications nanometer-sized features at a mirror's surface can in fact negatively affect the mirror's ability to reflect light due to plasmon absorption that exists in the metal nanoparticles that make up the reflective surface. When an incident light beam strikes the metal nanoparticles it causes free electrons at the surface of the metal (e.g. silver) to oscillate. The energy expended by the incident light beam to produce the oscillating electrons results in some of the light being lost.

As will be discussed in more detail below, to properly assess a roughness of an optical surface (e.g. a mirror surface) having nanometer-sized features, traditional RMS surface roughness measurement techniques can be inadequate. For this reason, according to some implementations power spectral density analysis is in some cases used to determine when a sufficient smoothing has been obtained. Hence, rather than relying on the evaluation of distinct features at the optical surface to determine if a target roughness has been met, a statistical distribution of roughness is instead used.

In the examples that follows, the optical surfaces are regarded to be surfaces of a mirror. It is appreciated, however, that the methods and structures disclosed herein are applicable to other types of optical surfaces and are in no way limited to those associated with mirrors.

Surface plasmon absorption can affect mirror reflectivity when light interacts with features smaller than the light wavelength on some metallic surfaces. The surface plasmon absorption is most noticeable in nanostructures of metals, such as silver, that have a large number of free electrons that may oscillate when there is light incident on the surface. As noted above, the energy expended by the incident light beam to produce the oscillating electrons results in some of the light being lost. In mirrors, this adversely affects its reflectance. In regard to reflective materials, such as silver, the strength of the coupling between the light and the plasmon oscillation depends on the surface topology where larger grain sizes result in higher surface absorption of light in comparison to smaller grain sizes. For this reason, in some applications it is important to minimize the roughness of the surface on which the reflective material is deposited in order to minimize the grain size of the reflective material.

Generally, surface plasmons (electron oscillations) are excited by light incident on a metallic surface. It is a specific type of oscillation that is bound to the interface, does not radiate, and propagates. (In some microscopic treatments of reflection, other oscillations that radiate simply lead to specular reflection; this is not that type of oscillation associated with plasmons). The plasmon excitation losses energy as it propagates through electrical resistance in the metal or secondary scattering mechanisms. Excitation of surface plasmons by light only occurs under specific conditions when evanescent waves are generated, e.g., under conditions of total internal reflection or even after scattering at a rough surface. The strength of the excitation (amount of energy coupled from the light to the plasmon) depends strongly on geometry such as the surface topography and angles of incidence, though of course the dielectric constants a materials at the metal interface, and the wavelength of light are also relevant. In fact, for perfectly smooth metallic surfaces it is impossible to excite a surface plasmon in the absence of total internal reflection (for example on the backside of a prism). Detailed analysis shows that the loss is greater for large grain sizes typical of rough surfaces. Thus reducing the grain size to create a smoother surface reduces the ability to lose energy through exciting surface plasmons.

FIGS. 1A-4 generically illustrate a substrate 10 that has an exterior base surface 11 above which an optical surface 50 is to be produced. In the figures, the base surface 11 is shown to include a few laterally spaced-apart asperities 12 that include peaks 13. In FIGS. 1A-4 the asperities 12 are shown to be uniformly spaced and to have peaks of equal heights. It is appreciated, however, that in reality the base surfaces of the substrates include a vast number of asperities that are not equidistantly spaced, nor possess peaks of equal height and shape. The characteristics of the substrate surface 11 in FIGS. 1A-4 are simplified for providing a simplified explanation of some of the smoothing processes disclosed and contemplated herein. It is also important to note that in practice the number of ALD layers used to form the ALD films will generally be in the hundreds or thousands. Moreover, FIGS. 1A-4 are not drawn to scale.

Figure 1B:
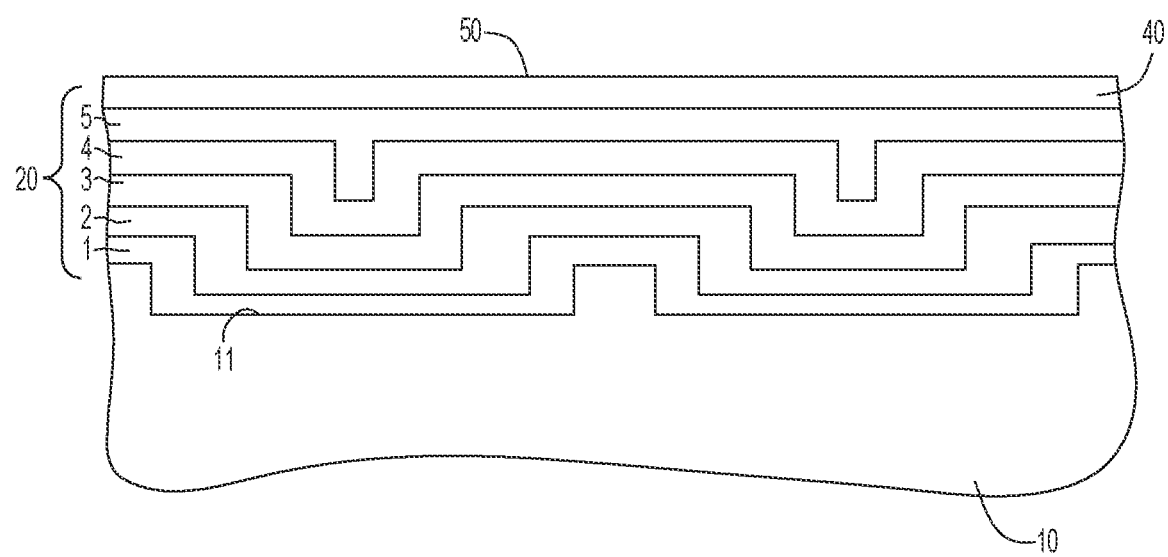
FIG. 1B illustrates the substrate of FIG. 1A having a reflective material deposited on the smoothed surface.

According to some implementations, as shown in FIGS. 1A and 1B, an optical surface 50 is produced by obtaining or making a substrate 10 that has an exterior base surface 11 above which the optical surface is to reside. The substrate 10 is obtained or made such that the base surface 11 includes laterally spaced-apart asperities 12 having peaks 13 that are spaced <1000 nanometers apart. The base surface 11 is smoothed using an atomic layer deposition process in which a plurality of sequentially deposited ALD layers 1 through 5 laid one atop the other to produce an ALD film 20 that fills spaces between the laterally spaced-apart asperities 12. According to some implementations the ALD film 20 has a final thickness of no more than one half an average lateral distance "d" between the peaks 13. According to one implementation, the ALD film 20 has a thickness in the range of 3 to 400 nanometers.

Upon having deposited the ALD film 20 onto the exterior surface 11 of the substrate 10, a reflective material 40 is deposited on the smoothed exterior of the substrate (that includes the ALD film surface 21) to produce the optical surface 50. According to one implementation, the reflective material 40 is deposited using an e-beam physical vapor deposition process. The smoothing is carried out such that the depositing of the ALD film 20 on the exterior surface 11 of the substrate 10 causes the grain size of the reflective material 40 to be reduced in comparison to the grain size that would otherwise exists without having deposited the ALD film 20 on the exterior surface of the substrate. The ALD film 20 is produced to have a thickness sufficient to cause a reduction in the grain size of the reflective material 40 that results in a reduction in plasmon absorption in the optical surface 50 in comparison to the plasmon absorption that would otherwise exist without having applied the ALD film to the substrate surface 11. According to one implementation, the smoothing of the substrate surface 11 is carried out to cause the grain size of the reflective material 40 to be in a range of 50 to 1000 nanometers as measured using high resolution transmission microscopy.

Figure 5:
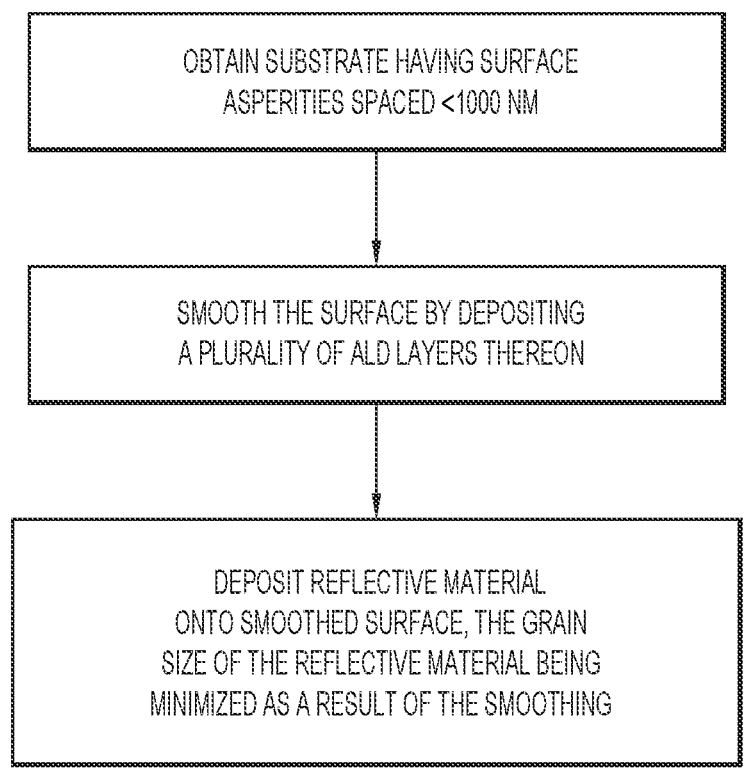
FIG. 5 is a flow diagram of a method for producing an optical surface according to the implementation of FIGS. 1A and 1B.

FIG. 5 is a flow diagram of a method for producing an optical surface according to the implementation of FIGS. 1A and 1B.

According to some implementations the ALD layers are comprised of one of $Al_2O_3$ layers, $SiO_2$ layers, $TiO_2$ layers, $ZrO_2$ layers, ZnO or $SiN_x$. According to other implementations the ALD layers comprise two or more of $Al_2O_3$ layers, $SiO_2$ layers, $TiO_2$ layers, $ZrO_2$ layers, ZnO and $SiN_x$.

According to some implementations, the reflective material is silver, gold, aluminum, germanium or chromium.

The obtaining or making of the substrate 10 may comprise a smoothing of the exterior surface 11, which according to one example includes a chemical mechanical polishing (CMP) of surface 11.

Figure 2A:
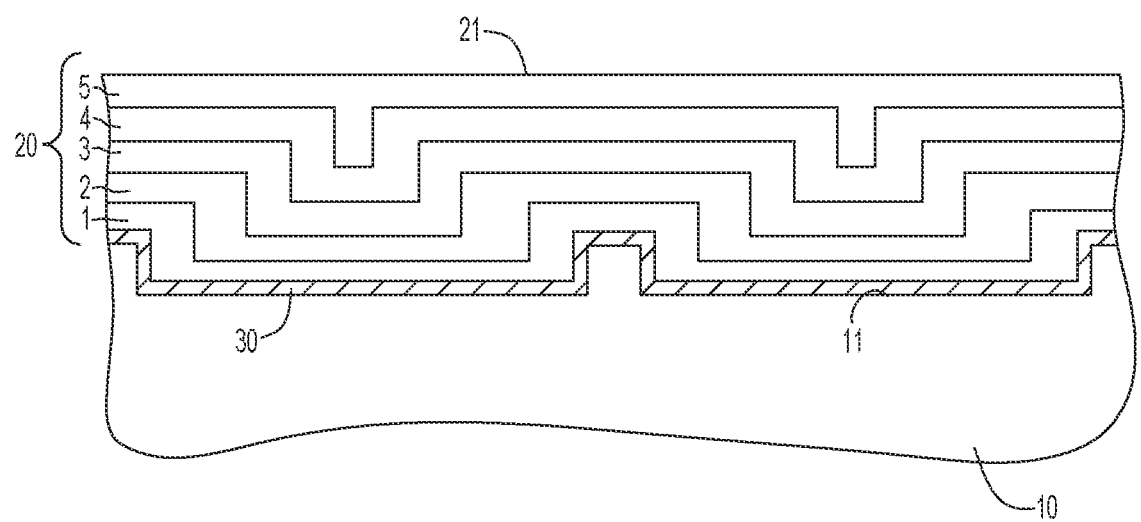
FIG. 2A shows a substrate similar to that of FIG. 1A with a metal film interposed between the base surface of the substrate and the plurality of ALD layers.
Figure 2B:
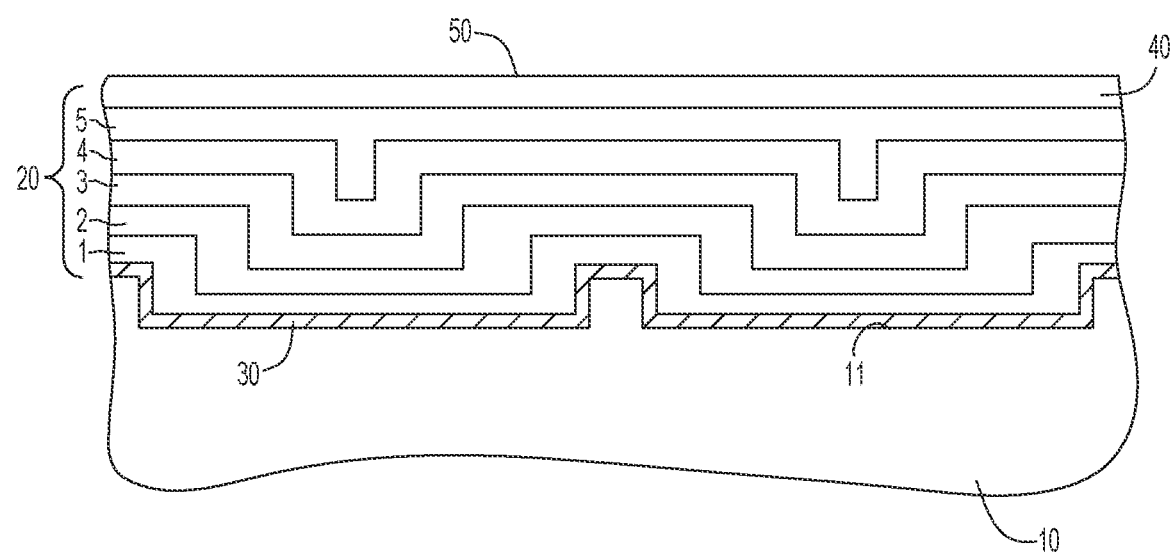
FIG. 2B illustrates the substrate of FIG. 2A having a reflective material deposited on the smoothed surface.

As shown in FIGS. 2A and 2B, alternatively or in conjunction with carrying out the CMP process, the exterior surface 11 of the substrate 30 may be processed before laying down the ALD layers by depositing a metal film 30 (which may comprise one or more metal layers) onto the base surface 11 of the substrate 10. The metal film 30 may comprise, for example, silver, gold, aluminum, germanium and chromium, and may be deposited onto the substrate surface 11 using a physical vapor deposition process or a chemical vapor deposition process.

Figure 6:
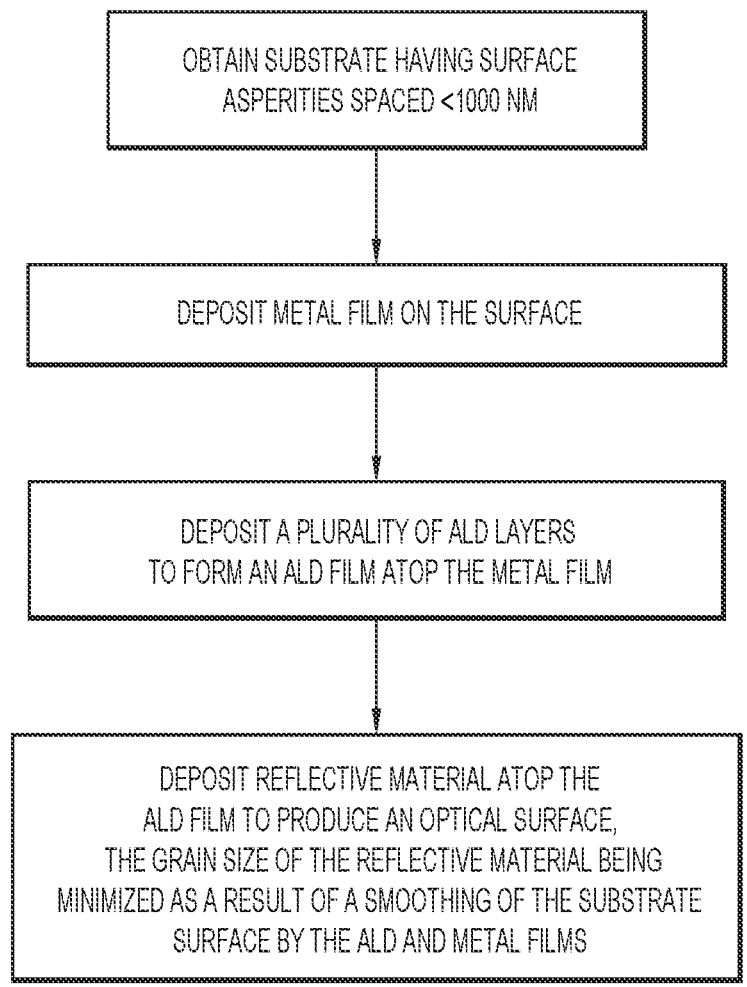
FIG. 6 is a flow diagram of a method for producing an optical surface according to the implementation of FIGS. 2A and 2B.

FIG. 6 is a flow diagram of a method for producing an optical surface according to the implementation of FIGS. 2A and 2B.

Figure 3:
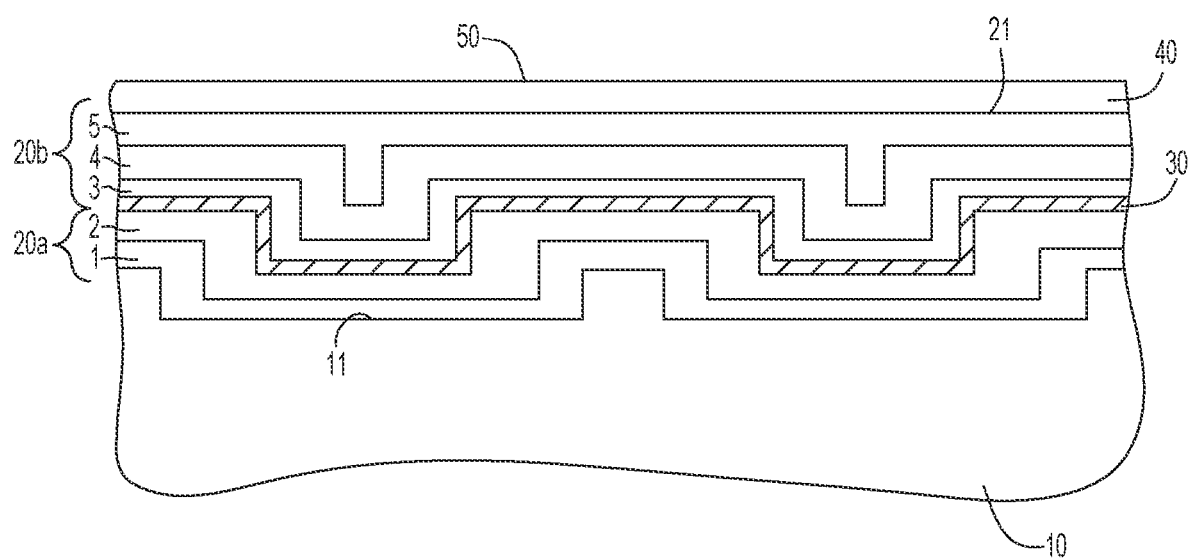
FIG. 3 illustrates a cross-section view of a substrate having an exterior surface with laterally spaced asperities, the substrate having deposited on a base surface of the substrate a first ALD film and atop the first ALD film a metal film. Atop the metal film is a second ALD film. The first and second ALD films and the metal film sandwiched between the first and second ALD films producing a smoothed surface on which an optical surface may be formed.

In the implementation of FIG. 3 the substrate 10 is processed such that a first plurality of ALD layers 1-2 is deposited onto the base surface 11 to form a first ALD film 20a. Thereafter, a metal film 30 (which may comprise one or more metal layers) is deposited atop the first ALD film 20a. This is followed by depositing a second plurality of ALD layers 3-5 atop the metal film 30 to produce a second ALD film 20b. Like the implementation of FIGS. 2A and 2B above, the metal film may comprise silver, gold, aluminum, germanium or chromium. Upon completion of the smoothing process, the reflective material 40 is then deposited on the surface of the second ALD film 20b to produce the optical surface 50.

Figure 7:
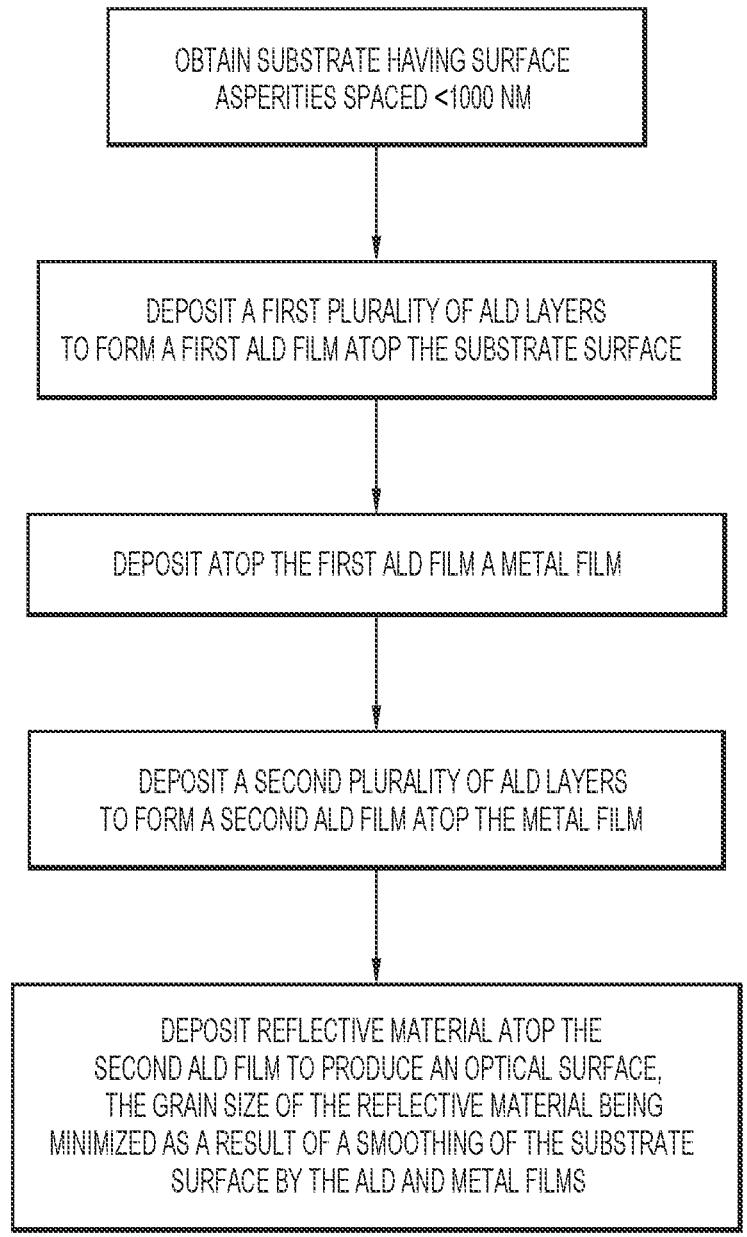
FIG. 7 is a flow diagram of a method for producing an optical surface according to the implementation of FIG. 3.

FIG. 7 is a flow diagram of a method for producing an optical surface according to the implementation of FIG. 3.

Figure 4:
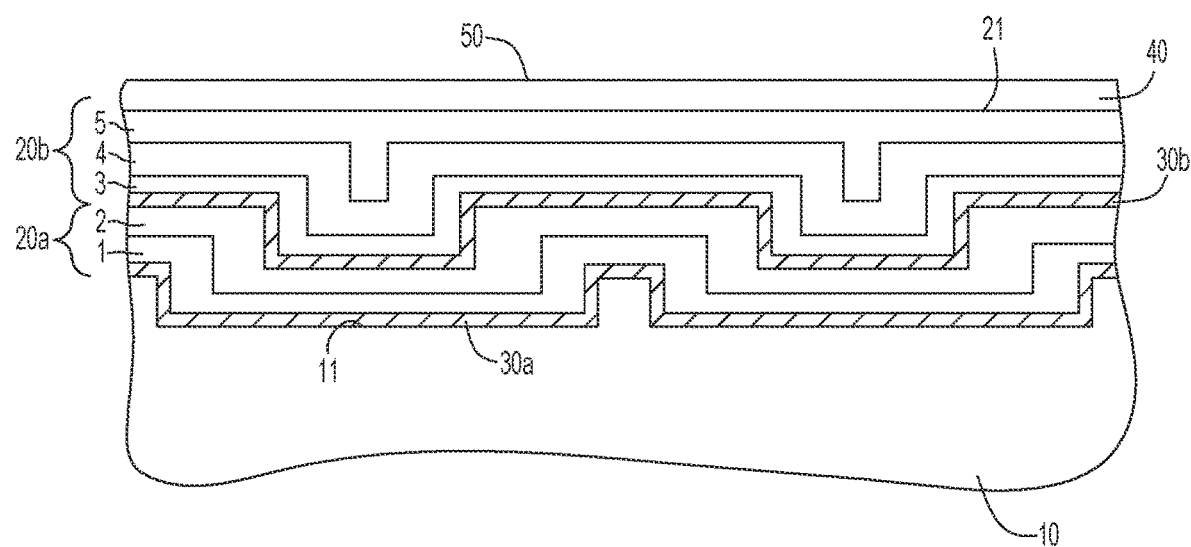
FIG. 4 illustrates a cross-section view of a substrate similar to that of FIG. 3, and additionally includes another a metal film interposed between the first ALD film and the base surface of the substrate.

FIG. 4 illustrates another method in which multiple metal films 30a and 30b and dielectric ALD films 20a and 20b are deposited in an alternating manner during the smoothing process. As shown in FIG. 4, the first metal film 30a is deposited onto the base surface 11 of the substrate 10 and a first plurality of ALD layers 1 and 2 are deposited atop the first metal film 30a to produce the first ALD film 20a. Thereafter, a second metal film 30b is deposited atop the first ALD film 20a and is followed by laying down a second plurality of ALD layers 3-5 atop the second metal film 30b to form the second ALD film 20b. The reflective material 40 is then deposited on the surface of the second ALD film 20b to produce the optical surface 50.

Figure 8:
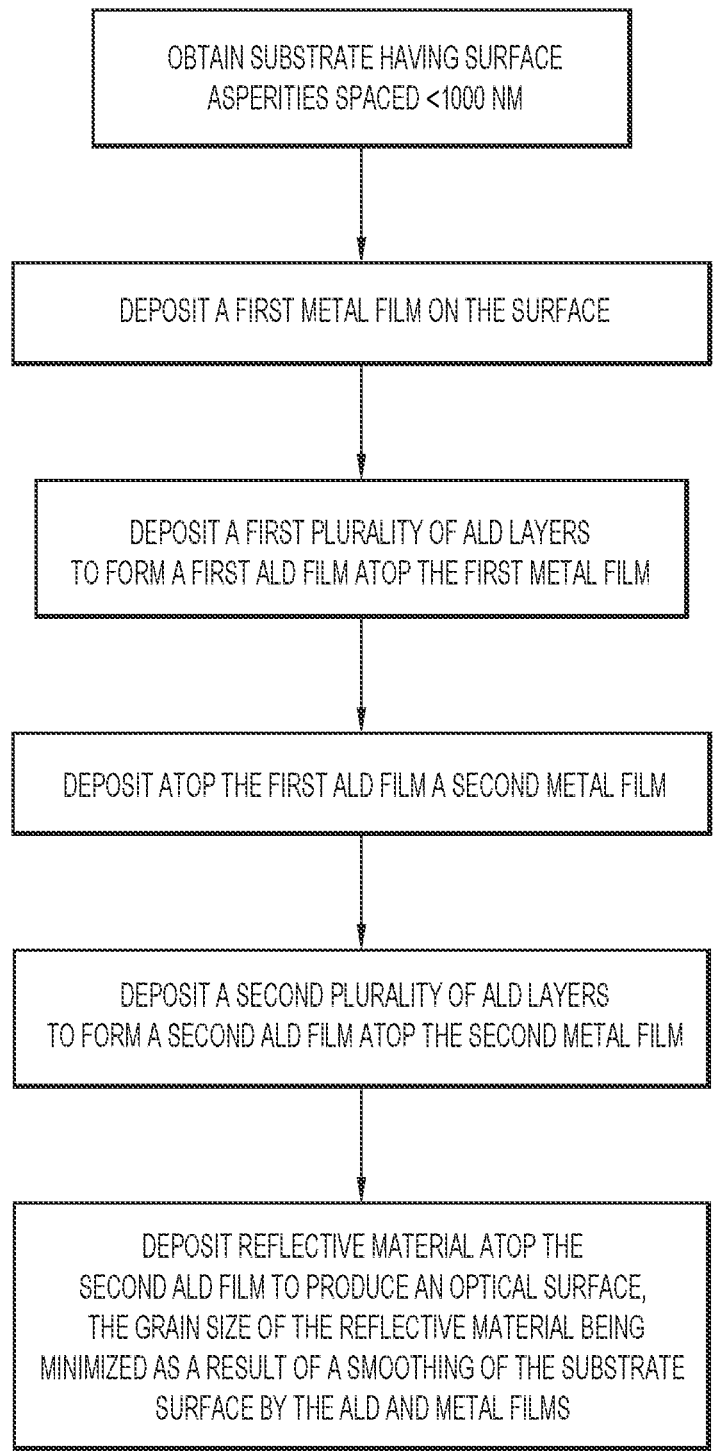
FIG. 8 is a flow diagram of a method for producing an optical surface according to the implementation of FIG. 4.

FIG. 8 is a flow diagram of a method for producing an optical surface according to the implementation of FIG. 4.

According to some implementations power spectral density analysis is used to determine when a sufficient smoothing has been obtained before the reflective material 40 is applied to the exterior-most surface of the substrate 10. (In the examples disclosed herein, prior to depositing the reflective material 40 the exterior-most surface of the substrate 10 includes a surface of an ALD film.) In some instances this includes determining the power spectral density of a surface topography of the exterior-most surface of the substrate using atomic force microscopy as a function of spatial frequency after the smoothing of the exterior of the substrate using the atomic layer deposition process. Thereafter, the determined power spectral density is compared to a predetermined target power spectral density at one or more spatial frequencies (see FIG. 9), the predetermined target power spectral density at the one or more spatial frequencies corresponding to a target roughness of the exterior of the substrate before the step of depositing the reflective material 40. In the example of FIG. 1A, after depositing a first plurality of ALD layers it is determined the predetermined target power spectral density at the one or more spatial frequencies has been met, the reflective material 40 is then deposited on the surface of the ALD film 20 and will have grain sizes in the desired range of 50 to 1000 nanometers. (That is, the target power spectral density is selected to cause the grains of the reflected material 40 to possess a size in the range of 50 to 1000 nanometers.) However, upon a determining that the exterior-most surface of the substrate 10 that includes the ALD film surface has a roughness greater than the target roughness, an additional step of smoothing the exterior of the substrate (including the ALD film surface) is performed, using the atomic layer deposition process to sequentially deposit a second plurality of ALD layers onto the exterior of the substrate. The power spectral density analysis is then repeated to determine if the target roughness has been achieved. The smoothing process is repeated until the target roughness is achieved, and thereafter, the reflective material 40 is applied to the outer-most layer of the ALD film. According to some implementations, the final ALD film thickness just prior to depositing the reflective material 40 onto the substrate 10 is in the range of 3 to 400 nanometers. An example of this iterative process is shown in the flow diagram of FIG. 10.

Figure 9:
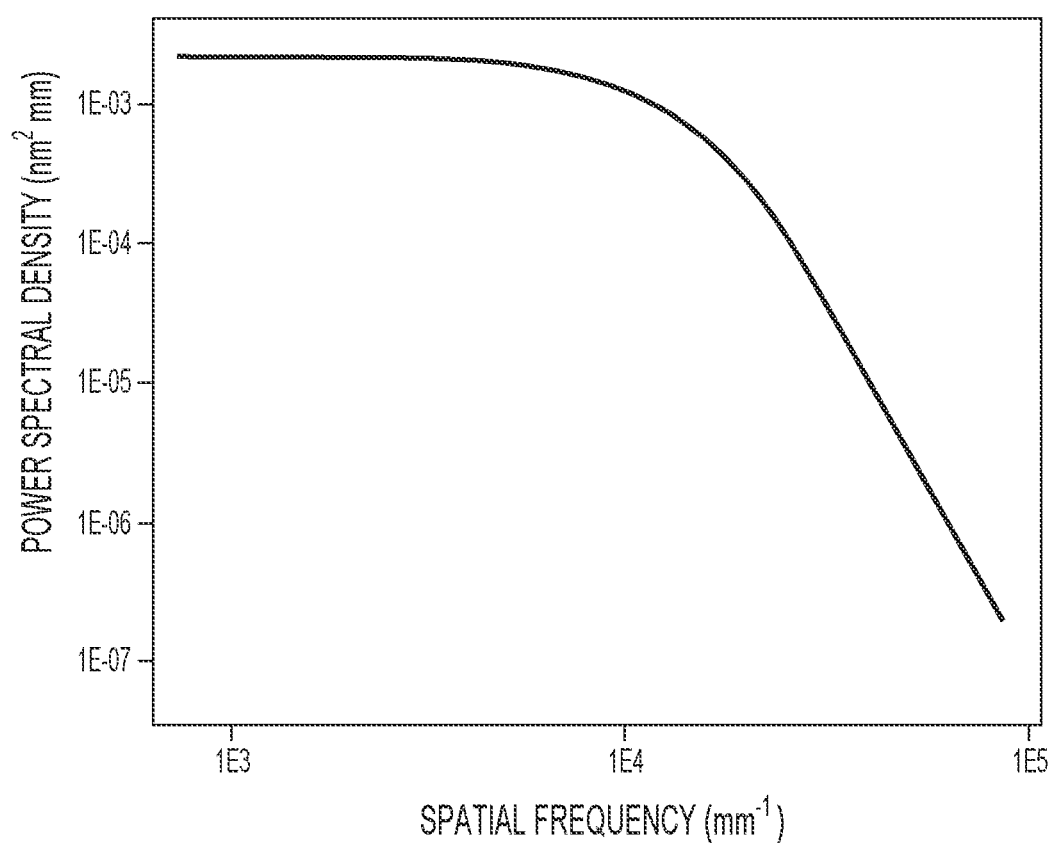
FIG. 9 is an example of a target power spectral density curve as a function of spatial frequency.
Figure 10:
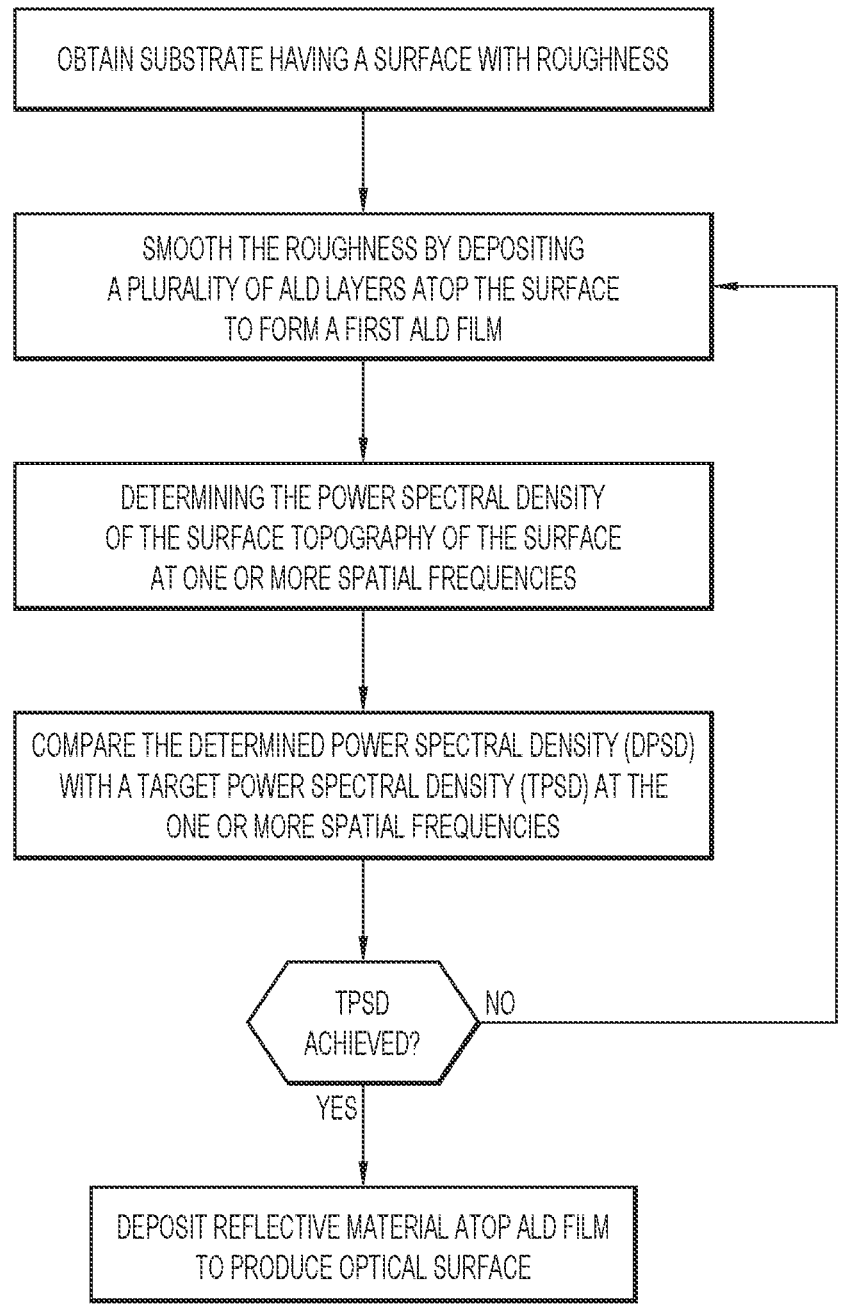
FIG. 10 is a flow diagram of a method for producing an optical surface according to another implementation.

FIG. 9 is an example of a predetermined power spectral density curve as a function of spatial frequency, wherein the spatial frequency on the x-axis represents surface roughness at various lateral distances between the spatial features.

Although only a number of examples have been disclosed herein, other alternatives, modifications, uses and/or equivalents thereof are possible. Furthermore, all possible combinations of the described examples are also covered. Thus, the scope of the present disclosure should not be limited by the particular examples disclosed herein.

What is claimed is:

1. A method of producing an optical surface, the method comprising:
    obtaining a substrate having an exterior above which the optical surface is to reside, the exterior including laterally spaced-apart asperities having peaks which are spaced <1000 nm apart and affect optical performance of the produced optical surface absent a smoothing of the exterior surface;
    smoothing the exterior of the substrate using an atomic layer deposition process to sequentially deposit a first plurality of ALD layers to produce an ALD film that fills spaces between the laterally spaced-apart asperities existing on the exterior surface; and
    depositing a reflective material on a surface of the ALD film to produce the optical surface, the smoothing resulting from depositing the ALD film on the exterior of the substrate causing the grain size of the reflective material to be reduced in comparison to the grain size that would otherwise exists without having deposited the ALD film on the exterior of the substrate, the reduction in grain size of the reflective material causing a reduction in plasmon absorption in the optical surface in comparison to the plasmon absorption that would otherwise occur in the optical surface without having reduced the grain size of the reflective material.

2. The method of producing an optical surface according to claim 1, wherein the first plurality of ALD layers are selected from the group consisting of $Al_2O_3$ layers, $SiO_2$ layers, $TiO_2$ layers, $ZrO_2$ layers, ZnO and $SiN_x$.

3. The method of producing an optical surface according to claim 1, wherein the first plurality of ALD layers comprises layers of different metals.

4. The method of producing an optical surface according to claim 3, wherein the layers of difference metals are selected from the group consisting of $Al_2O_3$ layers, $SiO_2$ layers, $TiO_2$ layers, $ZrO_2$ layers, ZnO and $SiN_x$.

5. The method of producing an optical surface according to claim 1, wherein the reflective material is selected from the group consisting of silver, gold, aluminum, germanium and chromium.

6. The method of producing an optical surface according to claim 1, wherein each of the laterally spaced-apart asperities has a peak, the ALD film having a thickness of no more than one half an average lateral distance between the peaks.

7. The method of producing an optical surface according to claim 6, wherein the ALD film has a thickness of 3 nanometers to 400 nanometers.

8. The method of producing an optical surface according to claim 1, further comprising an additional step of smoothing the exterior of the substrate prior to the depositing of the ALD film, the additional step of smoothing the exterior of the substrate comprising a chemical-mechanical polishing process.

9. The method of producing an optical surface according to claim 1, further comprising an additional step of processing the exterior of the substrate prior to the depositing of the ALD film, the additional step of processing the exterior of the substrate comprising depositing one or more layers of metal on the exterior surface of the substrate using a chemical vapor deposition process.

10. The method of producing an optical surface according to claim 1, further comprising an additional step of processing the exterior of the substrate prior to the depositing of the ALD film, the additional step of processing the exterior of the substrate comprising an ion-beam figuring process.

11. The method of producing an optical surface according to claim 1, further comprising an additional step of processing the exterior of the substrate prior to the depositing of the ALD film, the additional step of processing the exterior of the substrate comprising depositing one or more layers of metal on the exterior surface of the substrate using a physical vapor deposition process.

12. The method of producing an optical surface according to claim 11, wherein the metal is selected from the group consisting of silver, gold, aluminum, germanium and chromium.

13. The method of producing an optical surface according to claim 9, wherein the metal is selected from the group consisting of silver, gold, aluminum, germanium and chromium.

14. The method of producing an optical surface according to claim 1, further comprising:
    a first step of determining the power spectral density of a surface topography of the exterior of the substrate that includes the ALD film surface as a function of spatial frequency after the smoothing of the exterior of the substrate using the atomic layer deposition process; and
    a second step comprising comparing the power spectral density determined in the first step to a predetermined target power spectral density at one or more spatial frequencies, the predetermined target power spectral density at the one or more spatial frequencies corresponding to a target roughness of the exterior of the substrate before the step of depositing the reflective material.

15. The method of producing an optical surface according to claim 14, wherein upon a determining that the exterior of the substrate that includes the ALD film surface has a roughness greater than the target roughness, smoothing the exterior of the substrate that includes the ALD film surface using the atomic layer deposition process to sequentially deposit a second plurality of ALD layers onto the exterior of the substrate that includes the ALD film surface prior to depositing the reflective material.

16. The method of producing an optical surface according to claim 14, wherein the power spectral density at the one or more spatial frequencies is determined using atomic force microscopy.

17. A method of producing an optical surface, the method comprising:

obtaining a substrate having an exterior above which the optical surface is to reside, the exterior including laterally spaced-apart asperities;

smoothing the exterior of the substrate using an atomic layer deposition process to sequentially deposit a first plurality of ALD layers to produce an ALD film that fills spaces between the laterally spaced-apart asperities existing on the exterior surface;

a first step of determining the power spectral density of a surface topography of the exterior of the substrate that includes the ALD film surface as a function of spatial frequency after the smoothing of the exterior of the substrate using the atomic layer deposition process;

a second step comparing the power spectral density determined in the first step to a predetermined target power spectral density at one or more of the spatial frequencies, the predetermined target power spectral density at one or more spatial frequencies corresponding to a target roughness of the exterior of the substrate that includes the ALD film surface; and only upon a determining that the exterior of the substrate that includes the ALD film surface has a roughness equal to or less than the target roughness, depositing a reflective material on the smoothed exterior of the substrate that includes the ALD film surface to produce the optical surface.

18. The method of producing an optical surface according to claim 17, wherein upon a determining that the exterior of the substrate that includes the ALD film surface has a roughness greater than the target roughness, smoothing the exterior of the substrate that includes the ALD film surface using the atomic layer deposition process to sequentially deposit a second plurality of ALD layers onto the exterior of the substrate that includes the ALD film surface.

19. The method of producing an optical surface according to claim 17, wherein the smoothing resulting from depositing the ALD film on the exterior of the substrate results in the grain size of the reflective material to be reduced in comparison to the grain size that would otherwise exists without having deposited the ALD film on the exterior of the substrate, the reduction in grain size of the reflective material causing a reduction in plasmon absorption in the optical surface in comparison to the plasmon absorption that would otherwise occur in the optical surface without having reduced the grain size of the reflective material.

20. A method of producing an optical surface, the method comprising:

obtaining a substrate having an exterior on which the optical surface is to reside, the exterior including laterally spaced-apart asperities having peaks which are spaced <1000 nm apart and affect optical performance of the produced optical surface absent a smoothing of the exterior surface;

processing the exterior of the substrate using an atomic layer deposition process to sequentially deposit a first plurality of ALD layers to produce a first ALD film that fills spaces between the laterally spaced-apart asperities existing on the exterior surface;

depositing one or more layers of a metal onto a surface of the first ALD film using a physical vapor deposition process to form a metal film over the surface of the first ALD film;

smoothing a surface of the metal film using an atomic layer deposition process to sequentially deposit a second plurality of ALD layers to produce a second ALD film over the metal film; and depositing a reflective material on a surface of the second ALD film to produce the optical surface.

21. The method of producing an optical surface according to claim 20, wherein the metal film comprises a metal selected from the group consisting of silver, gold, aluminum, germanium and chromium.

* * * * *